(12) United States Patent
Endo et al.

(10) Patent No.: US 8,673,124 B2
(45) Date of Patent: Mar. 18, 2014

(54) MAGNET UNIT AND MAGNETRON SPUTTERING APPARATUS

(75) Inventors: Tetsuya Endo, Komae (JP); Einstein Noel Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 216 days.

(21) Appl. No.: 13/151,759

(22) Filed: Jun. 2, 2011

(65) Prior Publication Data

US 2011/0297537 A1    Dec. 8, 2011

(30) Foreign Application Priority Data

Jun. 3, 2010 (JP) ................................. 2010-127642
Mar. 2, 2011 (JP) ................................. 2011-045032

(51) Int. Cl.
*C23C 14/35* (2006.01)

(52) U.S. Cl.
USPC .................................. 204/298.2; 204/298.19

(58) Field of Classification Search
USPC ......................................... 204/298.19, 298.2
See application file for complete search history.

(56) References Cited

U.S. PATENT DOCUMENTS

| | | | | |
|---|---|---|---|---|
| 4,498,969 A | * | 2/1985 | Ramachandran | 204/192.12 |
| 5,593,551 A | * | 1/1997 | Lai | 204/192.12 |
| 6,258,217 B1 | * | 7/2001 | Richards et al. | 204/192.12 |
| 6,440,282 B1 | * | 8/2002 | Wada et al. | 204/298.2 |
| 2006/0219550 A1 | * | 10/2006 | Deppisch et al. | 204/298.16 |
| 2009/0000943 A1 | | 1/2009 | Furuya et al. | 204/192.12 |

FOREIGN PATENT DOCUMENTS

JP    2009-7637 A    1/2009

* cited by examiner

*Primary Examiner* — Rodney McDonald
(74) *Attorney, Agent, or Firm* — Fitzpatrick, Cella, Harper & Scinto

(57) ABSTRACT

The present invention provides a magnet unit and a magnetron sputtering apparatus which can suppress the consumption amount of a target by efficiently consuming the target and can easily cause erosion on the target to progress uniformly regardless whether the target size is small or large and whether the target is made of magnetic material or not. A magnet unit according to an embodiment of the present invention includes a member configured to be provided with a predetermined magnet, an internal magnet unit which is provided for the member and includes n magnet elements extending radially in the surface of the member from a predetermined position of the member in at least n (n: positive integer equal to or larger than 3) directions, the n magnet elements having one polarity on a side opposite to the member, and an external magnet unit which is provided for the member so as to surround the internal magnet unit along the shape of the internal magnet unit, the external magnet unit having the other polarity on a side opposite to the member.

9 Claims, 14 Drawing Sheets

Bxy>500G

ROTATION CENTER

ROTATION CENTER

RADIUS 190 mm

CROSS-SECTIONAL VIEW OF EROSION (HALF REGION ONLY)

CROSS-SECTIONAL VIEW OF
EROSION (HALF REGION ONLY)

CROSS-SECTIONAL VIEW OF
EROSION (HALF REGION ONLY)

CROSS-SECTIONAL VIEW OF
EROSION (HALF REGION ONLY)

CONTOUR LINE SHOWS CHANGE
OF EACH 100 GAUSS

US 8,673,124 B2

MAGNET UNIT AND MAGNETRON SPUTTERING APPARATUS

BACKGROUND OF THE INVENTION

1. Field of the Invention

The present invention relates to a magnet unit which is disposed on the backside of a cathode electrode supporting a target on the front side in sputtering and relates to a magnetron sputtering apparatus provided with the magnet unit.

2. Description of the Related Art

A magnetron sputtering apparatus generates magnetron on a target discharge surface using a magnet unit which is disposed on the back side of a cathode electrode supporting the target and confines the plasma to obtain a high density state thereof. Then, when an ion of the plasma generated in this apparatus collides with the target, target material is flicked out and attached to a substrate to form a thin film. The sputtering used in a deposition process of the semiconductor industry deposits a film from any kind of source material, and can deposit a high melting-point material such as platinum and tungsten and an insulating material, for example. In addition, the above sputtering is a method in which sputter particle energy is easily changed and it is also possible to control the crystalline state, magnetic property, insulating characteristic, stress, and the like of a film.

In a sputter phenomenon used in the sputtering process, glow discharge is generated on the target front, and an ion is extracted from the plasma generated by this glow discharge toward the target and accelerated to collide with the target surface, and thereby the ion flicks a sputter particle from the target surface as material of a film.

Then, a sputter cathode used in the sputtering process utilizes the following principle. A cathode magnet is disposed in the air on the back side of the target which is disposed in vacuum and the both are separated by a separation wall (e.g., back plate). Then, a magnetic tunnel is formed on the target surface having an endless track shape by a magnetic force line generated from a cathode magnet (here, in the magnetic tunnel, a group of points where a component perpendicular to the target surface is zero is called a "magnetic track"). When electric power is applied to the target in this state, an electric field is generated in the normal line direction of the target surface. An electron is confined in a region where the magnetic field and the electric field cross perpendicularly to each other, and the confined electron collides frequently with gas element to turn the gas element into an ion. The ion is accelerated by an electric field generated on the target front and causes the sputtering.

Meanwhile, the ion flicks an element on the target surface and thereby the target surface is eroded along with the elapse of operation time. When this erosion depth becomes close to the thickness of the target, the target needs to be replaced by a new one. Erosion speed and shape change depending on various factors such as an electric field magnitude and a magnetic flux density generated on the target front, a gas pressure during the sputtering, and the shape of the magnetic track. When the erosion speed is higher, the target needs to be replaced more frequently and the operation rate of the sputtering apparatus is reduced. On the other hand, the erosion speed is lower, the target needs to be replaced less frequently, and the operation rate of the sputtering apparatus can be increased. In many cases, this erosion progresses selectively in a partial region of the target surface (or, in a circumferential part thereof) and causes the erosion speed to become higher. It has been known that a factor greatly affecting the erosion speed and shape is the magnetic track, and many proposals have been provided regarding a cathode magnet shape for generating the magnetic track.

FIG. 23 is a plan view showing an arrangement pattern of permanent magnets disclosed by Japanese Patent Application Laid-Open Publication No. 2009-7637. The technique shown in FIG. 23 and described in Japanese Patent Application Laid-Open Publication No. 2009-7637 is a proposal regarding the cathode magnet shape. In FIG. 23, plural magnets 20 are disposed forming a magnetic field for confining the plasma, and the magnets 20 include magnets 20A and magnets 20B for plural magnet pairs. Further, the plural magnets 20A and 20B are configured to be rotatable by means of a rotation mechanism (not shown in the drawing). The plural magnets 20A and 20B are arranged so as to form a magnetic field extending to cross over a closed curve in the vicinity of the target surface and the rotation center exists in a region surrounded by the closed curve. The closed curve has plural convex parts and plural concave parts, and the distances from the convex parts to the rotation center are configured to be different from one another and also the distances from the concave parts to the rotation center are configured to be different from one another.

In Japanese Patent Application Laid-Open Publication No. 2009-7637, a magnetic track curve is configured to be longer at a position farther from the rotation center and the distances to the tops of the convex parts and to the concave parts are configured to be different from one another, in order to make the erosion speed the same at each radius. However, it is difficult to project an erosion point and the erosion speed at the time of magnetic circuit design performed only by way of such a geometric shape. In particular, this is because the plasma density on the target front which determines the erosion speed depends also on the magnetic flux density. For example, if the magnetic flux density is changed at a position even on the magnetic track having the same length, the erosion speed changes.

This point will be explained by the use of FIG. 25. FIG. 25 is a diagram showing a curve corresponding to a horizontal magnetic field position formed by the arrangement pattern of the magnets in FIG. 23. Here, a position of a part where the magnetic force line becomes parallel to the surface of the target is called a "horizontal magnetic field position". In Japanese Patent Application Laid-Open Publication No. 2009-7637, when the tops of convex parts A, B, and C (farthest points from the rotation center P) shown in FIG. 25 are denoted by a, b, and c, respectively, the distance from a rotation center P to the top a of the convex part A, the distance from the rotation center P to the top b of the convex part B, and the distance from the rotation center P to the top c of the convex part C are different from one another. Similarly, when the bottoms (positions closest to the rotation center P) of convex parts D, E, and F are denoted by d, e, and f, respectively, the distance from the rotation center P to the bottom d of the concave part D, the distance from the rotation center P to the bottom e of the concave part E, and the distance from the rotation center P to the bottom f of the concave part F are different from one another.

The method of causing the erosion to progress uniformly as explained in Japanese Patent Application Laid-Open Publication No. 2009-7637 assumes that the magnetic flux density is the same among the above convex parts A, B, and C and concave parts D, E, and F. It has been confirmed that the magnetic flux density are not always uniform on the magnetic track as shown in FIG. 26, when the magnetic flux density is obtained by simulation on the magnetic track of the target surface. This is because a density in the number of the magnets changes at a curved part when the magnets are disposed in a curve.

As described above, Japanese Patent Application Laid-Open Publication No. 2009-7637 assumes that the erosion progresses uniformly across the whole target by way of making an arc length of the magnetic track longer at a farther position from the rotation center, considering the movement speed of the magnetic track is higher at a position farther from the rotation center. However, Japanese Patent Application Laid-Open Publication No. 2009-7637 does not explain to the point whether the magnetic flux density is uniform or not on the magnetic track, and the erosion does not always progress uniformly there.

In particular, when the target is made of magnetic material, most of the magnetic force lines from the cathode magnet pass through the inside of the target, and thereby it is difficult to generate the magnetic track on a magnetic circuit in the same manner as in the design shown in FIG. 24A. Accordingly, sometimes the erosion speed becomes higher in an unexpected position and a target life becomes shorter. FIG. 24A shows a result of simulation of the magnetic track on the target surface when a magnetic target (saturated magnetic flux density: 1.0 T, thickness: 3 mm, and diameter: 160 mm) is applied to the magnetic circuit disclosed in Japanese Patent Application Laid-Open Publication No. 2009-7637. In FIG. 24A, Reference numeral 21 is a designed curve of a curve corresponding to the horizontal magnetic field position formed by the magnet arrangement pattern shown in FIG. 23. Further, Reference numeral 22 is an eroded region in the case of using the magnetic target. From this result, particularly in a case such as one in which the target is made of magnetic material, there are many regions in which the magnetic track does not overlap the magnetic circuit in an area on the left side of the magnet center in FIG. 24A. Further, a difference of the radii between from the target center to the convex parts and from the target center to the concave parts of the magnetic track has almost disappeared in the left area of this target.

Further, in the magnetic target, since the magnetic field is concentrated more at an eroded position as the erosion progresses, the magnetic field concentration occurs at the eroded position even when the most-deeply eroded part and the magnetic circuit does not coincide with each other as shown in FIG. 24B. That is, there is a limitation for a method in which the magnetic track includes many regions parallel to the rotation direction of the magnet unit and radii are shifted from one another in the convex and concave parts of the magnetic tracks, as the method of Japanese Patent Application Laid-Open Publication No. 2009-7637. In particular, when the target diameter is increased, it is difficult to cause the erosion to progress uniformly across the whole surface of the target without providing many radii for the convex parts and concave parts of the magnetic track. Note that, in FIG. 24, Reference numeral 23 indicates a magnetization direction in a minute region within the target and Reference numeral 24 indicates a magnetic force line on the target surface.

SUMMARY OF THE INVENTION

An object of the present invention is to provide a magnet unit and a magnetron sputtering apparatus which can suppress the consumption amount of a target by consuming the target efficiently regardless of whether the target size is small or large and regardless of whether the target is made of magnetic material or not and can easily cause the target erosion to progress uniformly.

A magnet unit and a magnetron sputtering apparatus of the present invention which has been realized for achieving the above object are configured as follows.

A first aspect of the present invention is a magnet unit of a magnetron sputtering apparatus which forms a magnetic track as a group of regions where a tangential line of a magnetic force line generated on a target becomes parallel to a surface of the target, the magnet unit comprising: a member configured to be provided with a predetermined magnet; an internal magnet unit which is provided for the member and includes n magnet elements extending radially in a surface of the member from a predetermined position of the member in at least n (n is a positive integer equal to or larger than 3) directions, the n magnet elements having one polarity on a side opposite to the member; and an external magnet unit provided for the member so as to surround the internal magnet unit along a shape of the internal magnet unit, the external magnet unit having the other polarity on a side opposite to the member.

A second aspect of the present invention is a magnetron sputtering apparatus, comprising a processing chamber capable of vacuum evacuation; a substrate holder which is provided in the processing chamber and capable of holding a substrate as an object to be processed; a cathode electrode which is arranged so as to face the substrate holder and to which discharge power is supplied; a target mounting plane which is provided at a substrate holder side of the cathode electrode and capable of mounting a target; and a transfer mechanism transferring the substrate to a position between the substrate holder and the cathode electrode, wherein the apparatus is configured such that the target can be mounted at the substrate holder side of the cathode electrode, and the magnet unit according to the first aspect of the present invention is disposed at the cathode electrode on a side opposite to the side of the substrate holder.

According to the magnet unit of this invention, the magnetic track regions parallel to the rotation direction of the magnet unit is reduced greatly and the magnetic tracks perpendicularly crossing the rotation direction of the magnet unit are increased, and thereby it becomes possible to cause the erosion occurring on the target to progress without being concentrated on a specific region and to extend the target life.

DETAILED DESCRIPTION OF THE INVENTION

Figure 1:
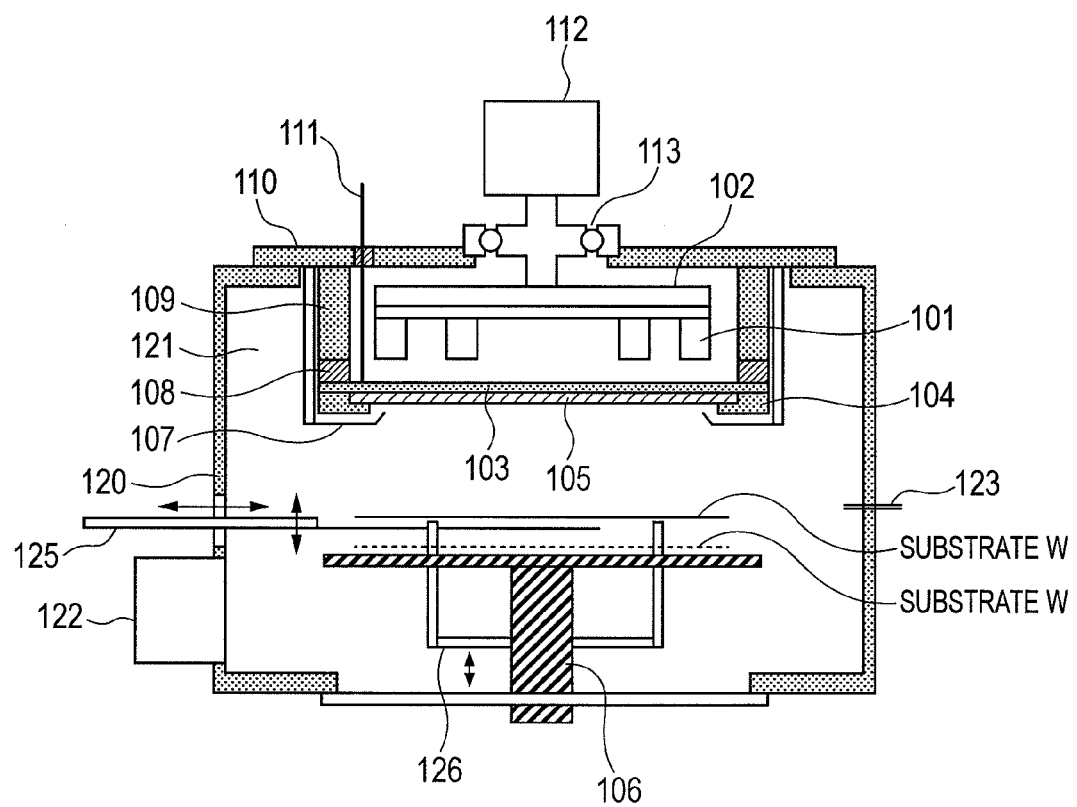
FIG. 1 is a diagram showing an example of a magnetron sputtering apparatus according to an embodiment of the present invention.

FIG. 1 is a diagram showing an example of a magnetron sputtering apparatus according to the present embodiment. The magnetron sputtering apparatus (hereinafter, called "sputtering apparatus") includes a cathode 121 and a substrate holder 106 within a vacuum container 120. A target support plate 103 covered by a cathode shield 107 is fixed to the vacuum container 120 by a cathode body 109 and a cathode base 110. Meanwhile, a target 105 is fixed onto the target support plate 103 by a target hold ring 104. In this manner, the above sputtering apparatus is configured so as to enable the target 105 to be disposed on the side of the substrate holder 106 of the cathode. A cooling system which is not shown in the drawing is disposed for the target support plate 103 and configured to cool the target 105. This sputtering apparatus of the present embodiment is a common apparatus mounting a magnet unit to be scribed below (magnet unit 101 of FIG. 1).

Electric power necessary for sputtering is applied to the target 105 from an electric power supply line 111 through the target support plate 103, and an insulating part 108 prevents the target 105 from being shorted to the earth, since the cathode base 110 and the vacuum container 120 are normally have the earth potential. Note that the electric power supply line is connected with an electric power source which is not shown in the drawing, and electric power such as DC power, high-frequency power, and high-frequency power superimposed on DC power can be input.

The magnet unit 101 is fixed to a magnet base (yoke) 102. The magnet base (yoke) 102 is connected to a rotation drive source 112 via a shaft bearing 113, and the magnet unit 101 is configured to be rotatable in the surface direction of the target 105 on the rear side of the target 105 (on the opposite side of the target 105 from the substrate holder 106).

Process gas can be supplied into the vacuum container 120 from a process gas introduction port 123 via a process gas flow amount control mechanism which is not shown in the drawing. Meanwhile, an exhaust mechanism 122 for performing impurity gas (atmosphere component) exhaust and process gas exhaust is provided for the vacuum container 120. A substrate W is transferred to the front of the target 105 (position for the substrate W) by a substrate transfer mechanism 125. When the substrate W is to be mounted on the substrate holder 106, the substrate W is placed on a substrate transfer up-and-down mechanism 126 which has moved to the upper side in advance and the substrate transfer mechanism 125 is caused to recede. After that, the substrate transfer up-and-down mechanism 126 is descended and the substrate W is mounted on the substrate holder 106 to be fixed by a substrate press bar which is not shown in the drawing. On the other hand, when the substrate W is caused to recede after film deposition, the substrate W is removed from the substrate holder 106 by the substrate transfer up-and-down mechanism 126 and mounted on the substrate transfer mechanism 125 for receding.

Next, a specific configuration of the magnet unit according to an embodiment of the present invention will be explained with reference to FIG. 2.

A first feature of the magnet unit according to an embodiment of the present invention is that the magnet unit 101 includes a ring-shaped external magnet unit 402 disposed on a yoke 412 which is made of ferromagnetic plate as a member configured to allow a predetermined magnet (e.g., internal magnet unit 401 and external magnet unit 402) to be provided, and the internal magnet unit 401 which is disposed within the external magnet unit 402 on the yoke 412 and has a polarity different from the external magnet unit 402. That is, the internal magnet unit 401 is provided within the hollow part of the hollow external unit 402.

Figure 2:
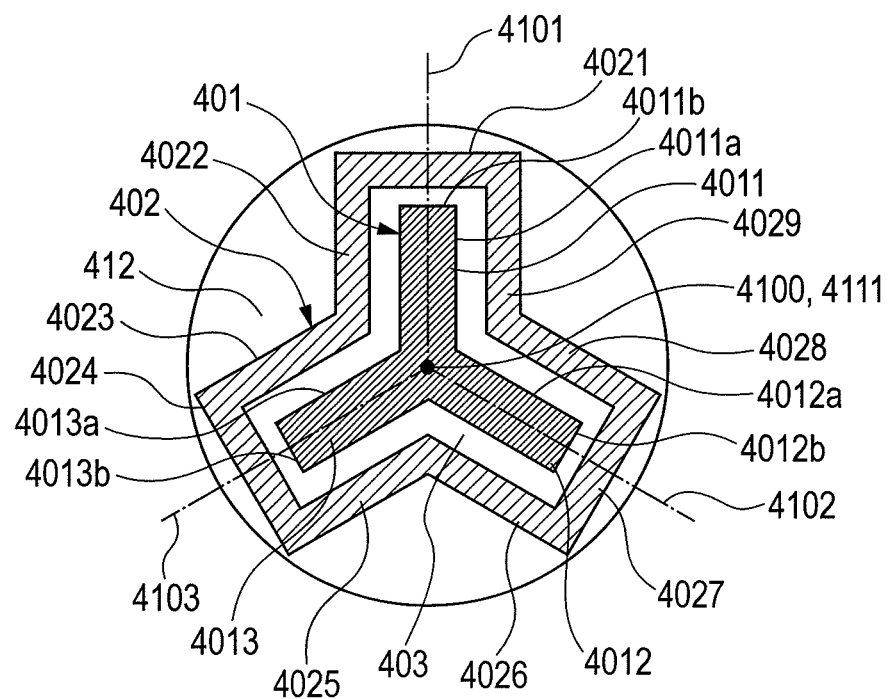
FIG. 2 is a diagram showing a first example of a magnet unit according to an embodiment of the present invention.

Note that, in the present specification, "ring-shape" is a shape such as one surrounding a predetermined space continuously in a closed loop shape and may be a closed loop having a polygonal shape as shown in FIG. 2, not limited to a ring shape. Accordingly, the ring-shaped external magnet unit 402 is a magnet formed so as to surround the internal magnet 401 continuously along the shape of the internal magnet unit 401 by the use of a magnet material having a polarity different from that of the internal magnet unit, for example.

The internal magnet unit 401 is configured to include n internal magnets extending radially in at least n directions (n: integer equal to or larger than 3) from a predetermined position of the yoke (radial center of the n internal magnets which coincides with the rotation center in FIG. 2), and the n internal magnet are integrated with one another. That is, the internal magnet unit 401 is an integrated magnet unit which has magnet parts extending in at least three directions from a predetermined position (radial center). In FIG. 2, the internal magnet unit 401 includes three rod-shaped magnets (also called "internal magnets") 4011, 4012, and 4013, the rod-shaped magnets 4011, 4012, and 4013 are disposed on the yoke 412 so as to extend radially in three directions, respectively, from a radial center 4100 of the predetermined position and also integrated with one another.

Note that, while the three internal magnets 4011, 4012, and 4013 are formed so as to cause one ends of the respective magnets to be integrated with one another at the radial center 4100 in FIG. 2, the configuration is not limited to this example. For example, one magnet including magnet parts extending radially in three directions on the surface of the yoke 412 from the radial center 4100 may be used as the internal magnet unit 401. Alternatively, the internal magnet unit 401 may be formed by way of integrating a bending part of a magnet which is curved in two directions with one end of a single rod-shaped magnet. In this manner, the internal magnet unit 401 may include magnet elements extending in at least three directions from a predetermined position (radial center) on the surface of the yoke on which the internal magnet unit 401 is provided, in the present embodiment. In the present specification, "magnet element" indicates a region having a magnet function (at least a part of a member functioning as a magnet). Accordingly, the magnet element may be a single magnet itself (e.g., 4011, 4012, or 4013) or may be a part of some magnet.

The external magnet unit 402 is provided on the yoke 412 so as to surround the internal magnet unit 401 along the shape of the internal magnet unit 401. Accordingly, the external magnet unit 402 is disposed apart from the internal magnet unit 401 having the same spacing along the whole periphery of the internal magnet unit 401. An example of the external magnet unit 402 has a 3n or more-angular shape which is disposed so as to surround the n internal magnets, and includes 3n or more rod-shaped external magnets. When n internal magnets are used as the internal magnet unit 401, the external magnet unit 402 preferably includes 3n rod-shaped external magnets and has a 3n or more-angular shape according to the shape of the internal magnet unit 401. In a magnet unit shown in FIG. 2 according to an embodiment of the present invention, n is determined to be three and the internal magnet unit 401 is a magnet unit integrating three rod-shaped magnets 4011, 4012, and 4013 extending radially from the radial center 4100 which coincides with the rotation center 4111 of the yoke 412. Further, the external magnet unit 402 includes 3n (3×3=9) rod-shaped external magnets 4021 to 4029 and has a 3n or more-angular shape (3×3=9 sides), and is disposed so as to surround three internal magnets 4011, 4012, and 4013. In the present example, the side of the external magnet unit 402 which does not contact the yoke 412 (exposed side) is assumed to have the N pole and the side of the internal magnet unit 401 which does not contact the yoke 412 (exposed side) is assumed to have the S pole. Obviously, there is no problem when the external magnet unit 402 has the S pole and the internal magnet unit 401 has the N pole. The external magnet unit 402 may be formed integrally by the use of a single magnet having a 3n or more-angular shape (3×3=9 sides), or maybe formed by way of separating a magnet having a 3n or more-angular shape (3×3=9 sides) into 3n magnets. Alternatively, the external magnet unit 402 may be formed by using magnets less than 3 by way of utilizing a bended magnet or the like, for example. That is, if a shape surrounding the internal magnet unit 401 (e.g., 3n-angular shape) can be realized resultantly, any number of magnets constituting the external magnet unit 402 and any forming method may be employed.

A second feature of a magnet unit according to an embodiment of the present invention is that each of the above three internal magnets 4011, 4012, and 4013 is arranged in a circumferential direction having an angle equal to or smaller than 180° with respect to a longitudinal direction of the neighboring internal magnet (radial axis of the internal magnet). That is, the internal magnets 4011, 4012, and 4013 are arranged radially so as to cause a radial axis 4101 coinciding with the longitudinal direction of the internal magnet 4011, a radial axis 4102 coinciding with the longitudinal direction of the internal magnet 4012, and a radial axis 4013 coinciding with the longitudinal direction of the internal magnet 4013 to make angles equal to or smaller than 180° in between, respectively. Note that, in the magnet unit of a first example which is shown in FIG. 2 and to be described below, the three internal magnets are arranged in a circumferential direction having the same angular spacing of 120° (360°/3) in between.

A third feature of a magnet unit according to an embodiment of the present invention is that the external magnet unit 402 is separated from the internal magnet unit 401 having the same spacing across the whole periphery of the internal magnet unit 401. In the example of FIG. 2, each side of the external magnet unit 402 having a polygonal shape having nine sides is parallel to some one of three internal magnets 4011, 4012, and 4013, and a gap having the same spacing is provided between each side of the external magnet unit 402 and some one of the internal magnets 4011 and 4012, and 4013 (e.g., a gap not smaller than 10 mm and not larger than 40 mm in which the magnetic force line can be generated on the target).

Hereinafter, the first to third features of the above magnet unit will be explained with reference to FIG. 2 to FIG. 5.

FIG. 2 shows a first example of a magnet unit to which the present invention can be applied. The internal magnet unit 401 is fixed to the yoke 412 made of magnetic material. Epoxy series adhesive is used for the fixing and the magnet is fixed not to move. The internal magnet unit 401 includes the three rectangular magnet elements 4011, 4012, and 4013 which are fixed along the hypothetically determined radial axes 4101, 4102, and 4103, respectively. Each of the magnet elements (internal magnets) 4011, 4012, and 4013 of the present example has the same rectangular shape, and, preferably, each of the long sides 4011*a*, 4012*a*, and 4013*a* has a length of 40 mm to 150 mm and each of the short sides 4011*b*, 4012*b*, and 4013*b* has a length of 10 mm to 70 mm. These values can be applied to a case in which the diameter of the magnet unit is 160 mm to 450 mm.

The magnet unit of the first example shown in FIG. 2 is rotatable about the rotation center 4111 on the yoke 412. Meanwhile, the radial axes 4101, 4102, and 4103 extend from a radial center 4100 and the rotation center 4111 and the radial center 4100 coincide with each other in this example. While the radial axes 4101, 4102, and 4103 make the same angle of 120 degrees with respect to neighboring axis in the magnet unit of this example, the arrangement is not limited to this example and, for example, the arrangement may have a relationship that the angle between the magnet element 4011 and the magnet element 4012 is 100 degrees, the angle between the magnet element 4012 and magnet element 4013 is 100 degrees, and the angle between the magnet element 4013 and the magnet element 4011 is 160 degrees. Alternatively, the arrangement also may have a relationship that the angle between the magnet element 4011 and the magnet element 4012 is 90 degrees, the angle between the magnet element 4012 and the magnet element 4013 is 120 degrees, and the angle between the magnet element 4013 and the magnet element 4011 is 150 degrees. That is, the three internal magnets 4011, 4012, and 4013 may be arranged in a circumferential direction having angles equal to or smaller than 180° between neighboring internal magnets, respectively, as described above in the second feature of the magnet unit.

In the magnet unit of the first example shown in FIG. 2, the external magnet unit 402 has a nine-angular shape of 3n-angular shape (n=3, 3×3=9), and includes the magnet elements (external magnets) 4021, 4022, 4023, 4024, 4025, 4026, 4027, 4028, and 4029. In the external magnet unit 402, the magnet elements 4021, 4024, and 4027 are provided in parallel to the short sides of the three internal magnets 4011*b*, 4013*b*, and 4012*b* so as to have gaps of the same spacing (e.g., not smaller than 10 mm and not larger than 40 mm) in between, respectively. Further, in the external magnet unit 402, the magnet elements 4022, 4023, 4025, 4026, 4028, and 4029 are provided in parallel to the long sides of the three internal magnets 4011*a*, 4013*a*, and 4012*a* so as to have gaps of the same spacing (e.g., not smaller than 10 mm and not larger than 40 mm) in between, respectively. These values can be applied to a case in which the diameter of the magnet unit is 160 mm to 450 mm.

Figure 3:
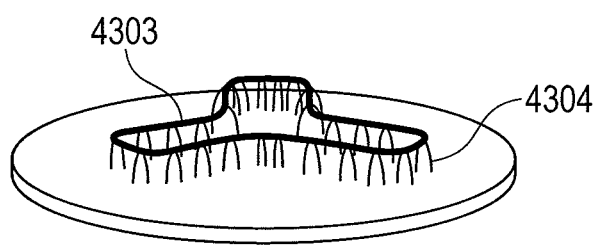
FIG. 3 is a diagram showing a relationship between a magnetic track and a magnetic force line in a first example of a magnet unit according to an embodiment of the present invention.

That is, in the magnet unit of the first example shown in FIG. 2, the magnet elements 4021 to 4029 of the external magnet unit 402 is fixed with the epoxy series adhesive or the like in the corresponding peripheries of the magnet elements 4011, 4012, 4013 of the internal magnet unit 401 without contacting the magnet elements 4011 to 4013 of the internal magnet unit 401. Accordingly, in the external magnet unit 402, the magnet does not peel off nor move around. Thereby, a magnetic circuit 403 is formed. Note that the magnetic poles on the surfaces of the internal magnet unit 401 and the external magnet unit 402 (surfaces facing the target 105 of FIG. 2) are different from each other. In the shape as described above, a magnetic force line 4304 is generated in a ring shape without ends which curves in the upper direction of the internal magnet unit 401 and the external magnet unit 402 as shown in FIG. 3. A magnetic track 4303 is defined to be a position where a magnetic field component parallel to the normal line direction of the target surface becomes zero on the magnetic force line 4304 (group of regions where the tangential line of the magnetic force line 4304 generated on the target becomes parallel to the target surface). The magnetic track 4303 is also a region where an electric field on the target and the magnetic force line 4304 cross each other perpendicularly and plasma is confined in this region.

Figure 4:
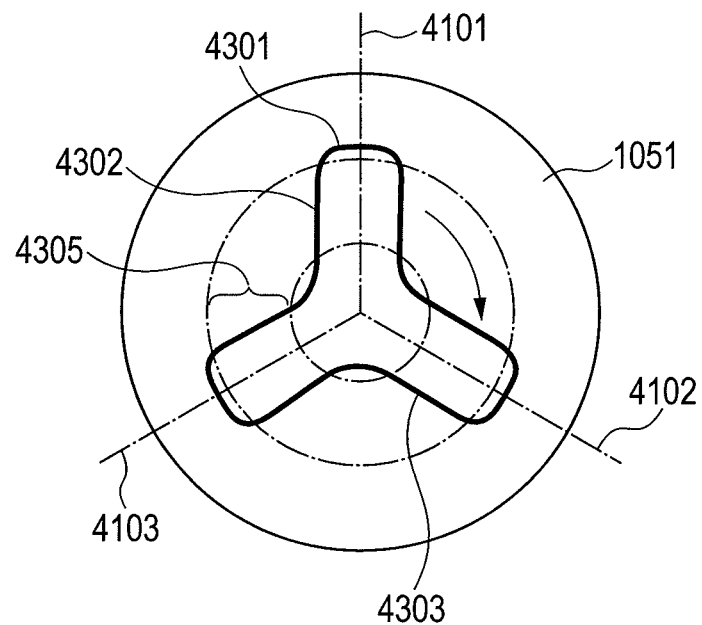
FIG. 4 is a diagram showing a magnetic track on a non-magnetic target formed by a magnet unit of a first example according to an embodiment of the present invention.

Next, an erosion process will be explained with reference to FIG. 4. The shape of the magnetic track 4303 on a non-magnetic target 1051 generated by the magnet unit shown in FIG. 2 coincides approximately with the magnetic circuit 403. A first reason why the shape of the magnetic track 4303 coincides approximately with the magnetic circuit 403 in the magnet unit of the present example is that the magnetic force line, which is generated by the internal magnet unit 401 including the three magnet parts (internal magnets 4011, 4012, and 4013) extending radially from the radial center 4100 that coincides with the rotation center 411 of the yoke plate and the external magnet unit 402 disposed so as to surround this internal magnet unit 401, can reach the target surface without being absorbed in the target inside. By the rotation of the magnet unit, the magnetic track 4303 is also rotated on the target and the confined plasma is also rotated. Since the erosion on the target progresses principally directly under the plasma, the rotation of the magnet unit moves an eroded region.

The magnetic track 4303 includes regions 4301 and 4302, and the region 4301 extends approximately in parallel to the rotation direction of the magnet unit and the region 4302 extends approximately in the perpendicular direction to the rotation direction of the magnet unit. When the rotation of the magnet unit also rotates the magnetic track 4303 on the non-magnetic target 1051, the region 4302 extends approximately in the perpendicular direction to the rotation direction of the magnet unit within a radial range 4305 on the target. Accordingly, by the rotation of the magnet unit, the region 4302 moves on a circumference while extending approximately in the perpendicular direction to the rotation direction of the magnet unit.

The increase of the erosion speed which makes the target life shorter is caused by the concentration of the plasma in the same region on the target, that is, caused by a longer time while an eroded region exists continuously in a particular region on the target. Accordingly, considering the rotation of the magnet unit and the magnetic track direction with respect to the rotation direction as in the present embodiment, it is possible to greatly shorten the time while the region 4302 on the magnetic track 4303 exists continuously in the same region on the target 1051. As a result, the erosion speed is reduced and this results in the effect of extending the target life.

Meanwhile, although the region 4301 is parallel to the rotation direction, the region 4301 has a short length and a longer distance from the rotation center than the radial range 4305. Then, the movement speed thereof is higher than the radial range 4305. From such a reason, the time while the magnetic track exists continuously in the same region is short and the erosion speed is reduced, and this results in the effect of extending the life.

As described above, in the magnet unit according to an embodiment of the present invention, the internal magnet 401 is configured so as to include the three magnet elements 4011, 4012, and 4013 which extend radially from the rotation center of the yoke (above first feature). Further, the three magnet elements 4011, 4012, and 4013 are arranged in the circumferential direction having the same angular spacing 120° in between (above second feature). Moreover, each side of the external magnet which has a polygonal shape having nine sides is disposed in parallel to some one of the long sides and short sides of the magnet elements as the three internal magnets, so as to have a gap of the same spacing in between (above third feature). According to these three features, the region 4301 of the magnetic track 4303 can be made approximately parallel to the rotation direction of the magnet unit and the region 4302 of the magnetic track 4303 can be made approximately perpendicular to the rotation direction of the magnet unit. Accordingly, regardless whether the target size is small or large, it is possible to suppress the target consumption by consuming the target efficiently and easily to cause the erosion on the target to progress uniformly.

Figure 23:
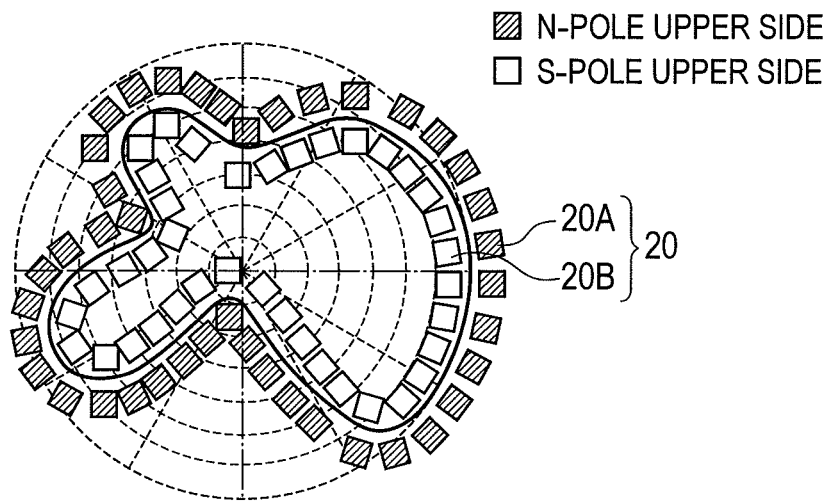
FIG. 23 is a plan view showing a conventional arrangement pattern of permanent magnets.
Figure 24A:
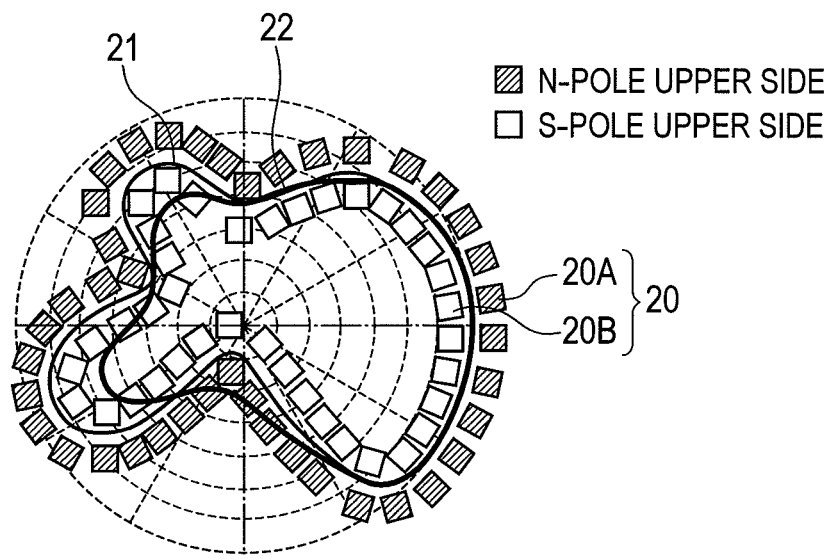
FIG. 24A is a diagram showing a result of simulation for a magnetic track on the surface of a magnetic target using the arrangement pattern of permanent magnets shown in FIG. 23.
Figure 24B:
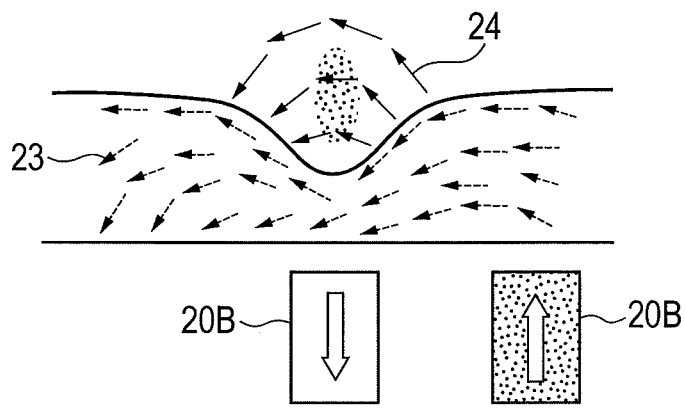
FIG. 24B is a diagram showing a relationship between an eroded region and a magnetic force line in the arrangement pattern of permanent magnets shown in FIG. 23, when a target is made of magnetic material.
Figure 25:
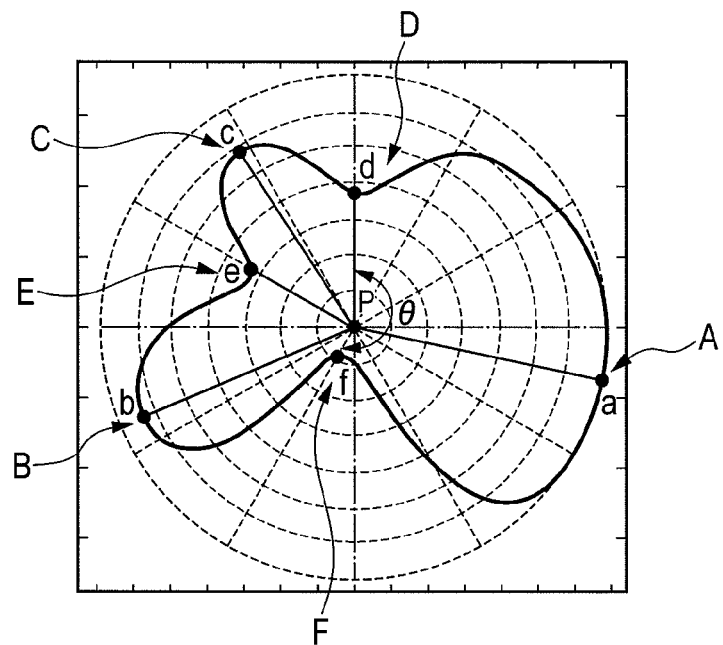
FIG. 25 is a diagram showing a curve corresponding to a horizontal magnetic position formed by the arrangement pattern of permanent magnets in FIG. 23.
Figure 26:
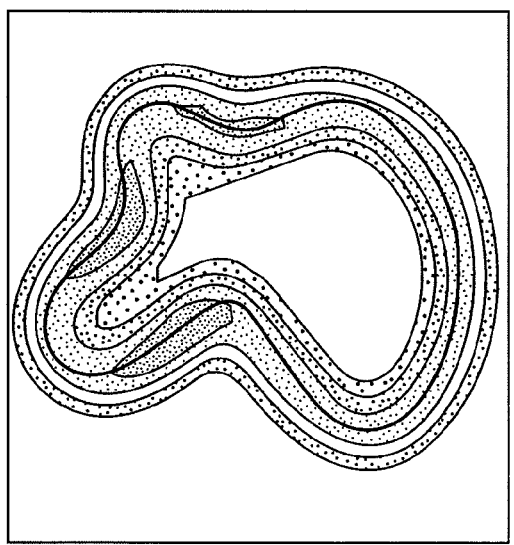
FIG. 26 is a diagram showing a result of simulation for a magnetic track on the surface of a non-magnetic target using the arrangement pattern of permanent magnets shown in FIG. 23.

Further, since both of the internal magnet unit 401 and the external magnet unit 402 are formed as an integrated magnet in the present embodiment, the non-uniformity of the density in the number of magnets is suppressed at a curved part as shown in FIGS. 23 and 24. Accordingly, it is possible to improve the uniformity of the magnetic flux at the curved part of the magnetic track 4303.

The above contents are obviously effective regardless whether the magnet size is small or large and effective for making the design of the magnet very easy.

Figure 5:
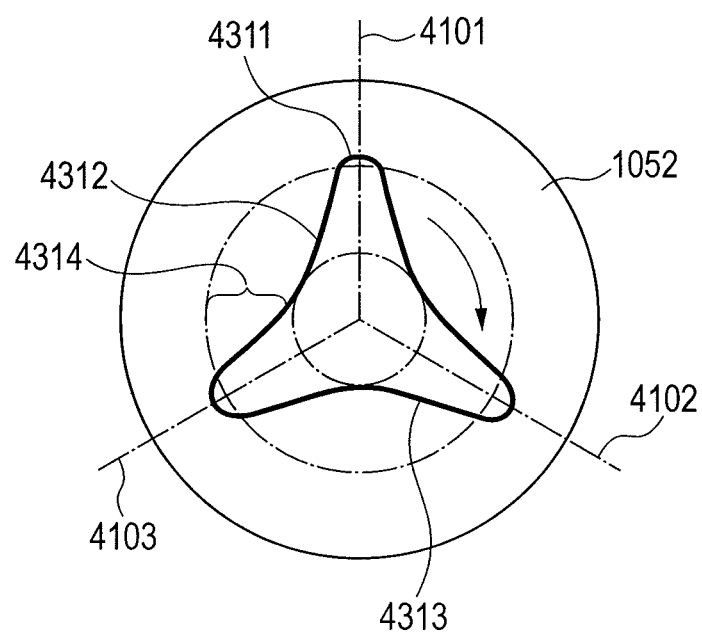
FIG. 5 is a diagram showing a magnetic track on a magnetic target formed by a magnet unit of a first example according to an embodiment of the present invention.

FIG. 5 is a diagram showing a shape of the magnetic track when the magnet unit of the first example of the present embodiment shown in FIG. 2 is used for a magnetic target. An erosion process will be explained with reference to FIG. 5. A magnetic track 4313 is generated by the magnet unit shown in FIG. 2 on the magnetic target 1052. The magnetic track 4313 is rotated by the rotation of the magnet units to prevent erosion on the magnetic target 502 from being concentrated. The magnetic track 4313 includes regions 4311 and 4312, and the region 4311 extends approximately in parallel to the rotation direction of the magnet unit and the region 4312 extends in an angle slightly shifted from the perpendicular direction to the rotation direction of the magnet unit. The reason why the shape of the magnetic track 4313 on the magnetic target 502 is different from that of the magnetic track 4303 on the non-magnetic target 1501 in this manner would be that the saturation magnetic flux density of the magnetic target 1502 is higher than that of the non-magnetic target 1501 and more of the magnetic force lines from the magnet unit pass through the inside of the magnetic target 1502.

When the magnetic track 4313 is rotated on the magnetic target 1052 by the rotation of the magnet unit, the region 4312 moves on a periphery while extending approximately in the perpendicular direction with respect to the rotation direction of the magnet unit, although the region 4312 extends in a direction having a small angle from the perpendicular direction to the rotation direction. Accordingly, the region 5312 of the magnetic track 4313 has a very short time for existing continuously in the same region on the target 1052 (radial range 4314). As a result, the erosion speed becomes lower and this results in the effect of extending the target life.

Meanwhile, the region 4311, although being approximately parallel to the rotation direction, has a longer distance from the rotation center than the radial range 4314 on the magnetic target 1052 and thereby has a higher speed than the radial range 4314. As a result, the existence time in the eroded region becomes short, resulting in reducing the erosion speed and extending the life. That is, it is clear that the target life can be extended regardless whether the target size is small or large and for both of the magnetic target and the non-magnetic target by applying the present embodiment.

In this manner, in the magnet unit shown by the first example according to an embodiment of the present invention, it becomes possible to form the track regions 4301 and 4311 which extend in parallel to the rotation direction of the magnet unit and the magnetic track regions 4302 and 4312 which extend perpendicularly to the rotation direction of the magnet unit regardless whether the target is made of the magnetic material or the non-magnetic material. Accordingly, it is possible to extend the target life regardless whether the target size is small or large, and also for both of the magnetic target and the non-magnetic target. Particularly in the magnet unit of the first example, the rotation center 4111 of the yoke and the radial center 4100 of the internal magnet unit 401 extending radially coincide with each other. Further, the external magnet unit 402 has a polygonal shape having 3×3=9 sides and each of the magnet elements in the external magnet unit 402 are arranged in parallel to some one of the magnet elements in the internal magnet unit 401 so as to have a constant spacing in between. This provides a technical meaning that all the three magnet elements 4011, 4012, and 4013 can be made as long as possible and the range of the track region extending perpendicularly to the rotation direction of the magnet unit becomes longer, and a uniform erosion can be obtained.

Figure 6:
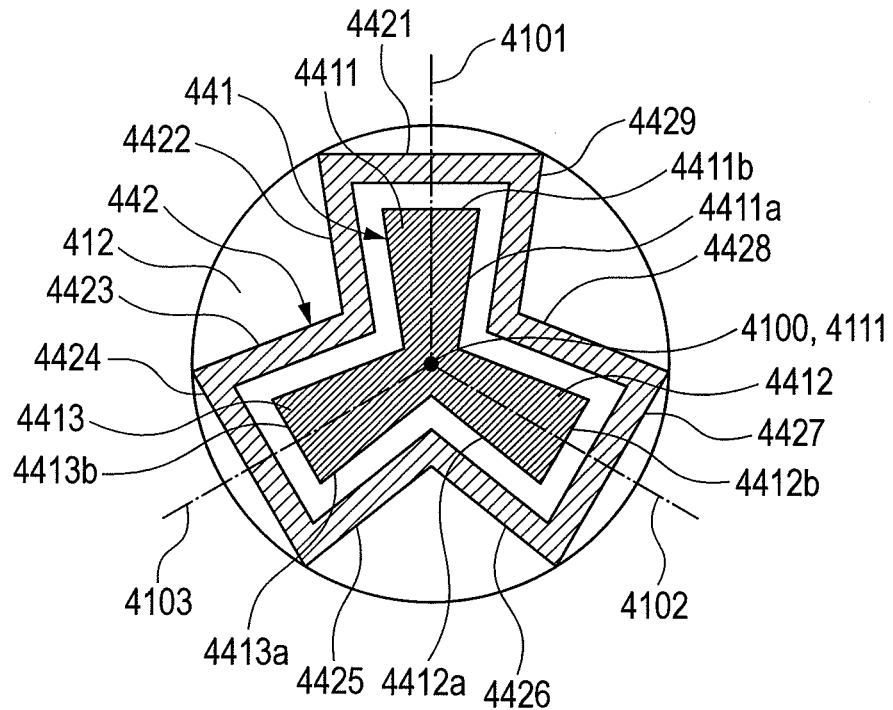
FIG. 6 is a diagram showing a magnet unit of a second example according to an embodiment of the present invention.
Figure 7:
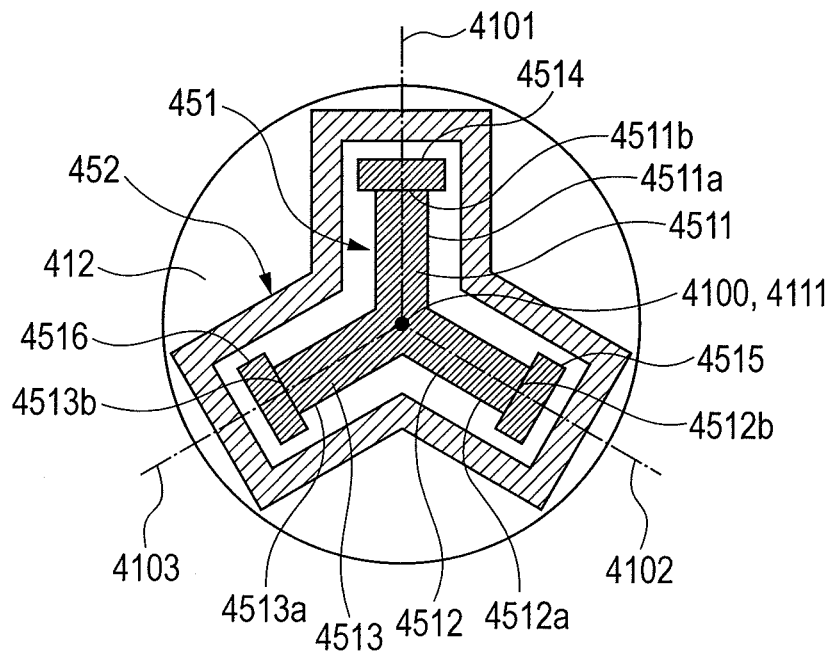
FIG. 7 is a diagram showing a magnet unit of a third example according an embodiment of the present invention.

FIG. 6 and FIG. 7 are diagrams showing magnet units of a second example and a third example which are modifications from the magnet unit of the above first example, respectively. External magnet units 442 and 452 have the N-poles and internal magnet units 441 and 451 have the S-poles. Obviously, there is no problem when the external magnet units 442 and 452 have the S-poles and the internal magnet units 441 and 451 have the N-poles. It is also effective to cause each of internal magnets 4411, 4412, and 4413 of the internal magnet unit 441 to have a shape such as one spreading from the radial center 4100 toward the outer circumference as shown in FIG. 6. In this method, it become possible to make the magnetic track closer to the perpendicular direction to the rotation direction in a range corresponding to the regions 4302 and 4312 of FIG. 4 and FIG. 5, respectively, for example.

The magnet unit of the second example shown in FIG. 6 is the same as the magnet unit of the first example in that the internal magnet unit 441 includes three rectangular magnet elements extending from the radial center 4100 which is the same as the rotation center 4111 of the yoke 412. Then, the magnet unit shown in FIG. 6 is the same as the magnet unit of the above first example also in that the internal magnet unit 441 includes three magnet elements (internal magnets) 4411, 4412, and 4413 extending from the radial center 4100 which is the same as the rotation center 4111. The magnet unit 411 of the second example shown in FIG. 6, however, is different from the magnet unit of the above first example in that the long sides 4411*a* of the magnet element 4411 are spread along the radial axis 4101 toward the outer peripheral, the long sides 4412*a* of the magnet element 4412 are spread along the radial axis 4102 toward the outer peripheral, and the long sides 4413*a* of the magnet element 4413 are spread along the radial axis 4103 toward the outer peripheral. In FIG. 6, more apart from the radial center 4100, distances between the radial axis 4101 and the long side 4411*a*, between the radial axis 4102 and the long side 4412*a*, and between the radial axis 4103 and the long side 4413*a* become larger. Note that distances between the radial axis 4101 and the long side 4411*a*, between the radial axis 4102 and the long side 4412*a*, and between the radial axis 4103 and the long side 4413 may be configured to become smaller more apart from the radial center 4100.

Further, the external magnet unit 442 includes magnet elements (external magnet) 4421 to 4429 and is formed so as to surround the internal magnet unit 441 along the shape of the internal magnet unit 441 which includes the three magnet elements 4411, 4412, and 4413 each having a tapered shape.

It is the same as in the first unit of the above first example that each pair of a short side 4411*b* of the magnet element 4411 in the internal magnet unit 441 and the magnet element 4421 in the external magnet unit 442, a short side 4412*b* of the magnet element 4412 in the internal magnet unit 441 and the magnet 4427 in the external magnet unit 442, and a short side 4413*b* of the magnet element 4413 in the internal magnet unit 441 and the magnet 4424 in the external magnet unit 442 are provided in parallel to each other so as to have a constant spacing in between.

When the magnet unit 411 of the second example of the present embodiment is used for the magnetic target, a magnetic track is formed as shown in FIG. 5. The region 4311 extends in parallel to the rotation direction of the magnet unit of the second example shown in FIG. 6 and the region 4312 extends in an angle slightly shifted from the perpendicular direction with respect to the rotation direction of the above magnet unit of the above second example. By using the magnet unit of the second example shown in FIG. 6, it is possible to correct the direction of the magnetic track in the region 4312, which extends in an angle slightly shifted from the perpendicular direction to the rotation direction of the magnet unit for the second example, into the perpendicular direction.

The magnet unit of the third example shown in FIG. 7 is the same as the magnet unit of the above first example in that an internal magnet unit 451 includes three rectangular magnet elements (internal magnets) 4511, 4512, and 4513 extending from the radial center 4100 which is the same as the rotation center 4111 of the yoke 412. In the magnet unit of the third example, rectangular magnet elements 4514, 4515, and 4516 are attached to the respective rectangular magnet element 4511, 4512, and 4513. The magnet element 4514 is preferably longer than the short side 4511*b* of the rectangular magnet unit 4511. The magnet element 4515 is preferably longer than the short side 4512*b* of the rectangular magnet unit 4512. The magnet element 4516 is preferably longer than the short side 4513*b* of the rectangular magnet unit 4513. The other configuration is the same as that of the magnet unit of the above first example. In FIG. 7, Reference numerals 4511*a*, 4512*a*, and 4513*a* indicate long sides of the magnet elements 4511, 4512, and 4513, respectively.

When the magnet unit 412 of the third example in the present embodiment is used for the magnetic target, a magnetic track as shown in FIG. 5 is formed. The region 4311 extends approximately in parallel to the rotation direction of the magnet unit 412 and the region 4312 extends in an angle slightly shifted from the perpendicular direction of the rotation direction of the magnet unit 412. By using the magnet unit of the third example shown in FIG. 7, it is possible to correct the magnetic track in the region 4312, which extends in an angle slightly shifted from the rotation direction of the magnet unit of the third example, into the perpendicular direction.

Figure 8:
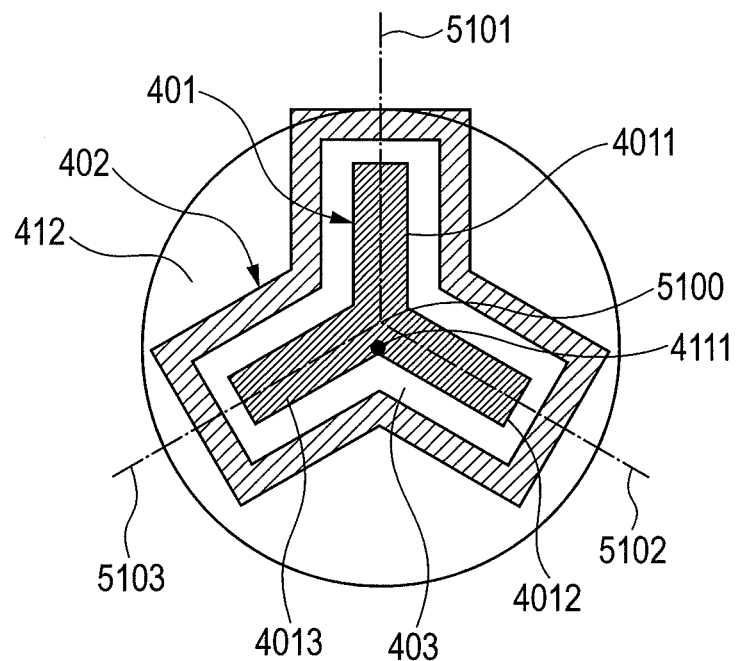
FIG. 8 is a diagram showing a magnet unit of a fourth example according to an embodiment of the present invention.
Figure 9:
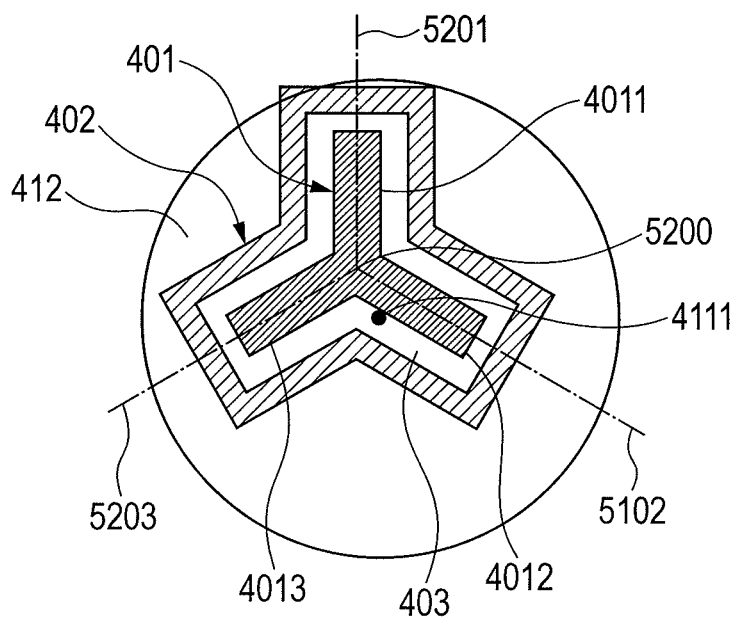
FIG. 9 is a diagram showing a magnet unit of a fifth example according to an embodiment of the present invention.

FIG. 8 is a diagram showing a magnet unit of a fourth example to which the present embodiment can be applied. A difference between the magnet unit of the fourth example and the magnet unit of the first example described above is that a radial center 5100 from which the magnet elements of the internal magnet unit extend radially is different from the rotation center 4111 (called off-center). An off-center direction is preferably a direction in which the circuit 403 comes closer to the rotation center 4111. In addition, an application example such as a magnet unit of a fifth example as shown in FIG. 9 also can be used. A radial center 5200 of the internal magnet unit 401 and the rotation center 4111 are off-centered from each other, and this is an example in which the direction and the distance thereof are different from those in the magnet unit of the fourth example. In any case, the feature here is that the radial center 5100 or the radial center 5200 and the rotation center 4111 are off-centered from each other as shown in the fourth example of FIG. 8 and the fifth example of FIG. 9. The off-center position (distance and direction) may cause the rotation center 4111 to shift to a position not contacting the external magnet unit 402. In this range, the magnetic track (high density plasma region) generated by the magnetic circuit 403 comes close to the target center, and it becomes possible to cause the erosion to progress securely to the target center and to exhibit a technical effect that the extent of the erosion at the target center can be adjusted when the magnet unit is designed.

If the off-center causes the rotation center 4111 to be set onto the external magnet unit 402 or to the outside of the external magnet unit 402, the high density plasma generated along the magnetic track rotating on the target overlaps the target center and the erosion speed is abnormally increased in the target center region. Accordingly, the most appropriate off-center position is preferably a position to cause the rotation center 4111 to exist on the magnetic circuit 403 or on the internal magnet unit 401 and also within an area 5 mm away from a plane contacting the magnetic circuit 403. This is because, when the rotation center 4111 enters inside in 5 mm or farther, the high density plasma moves apart from the target center and the erosion does not progress to the target center, and the re-deposition of a film occurs at the target center to cause a foreign particle.

Figure 10:
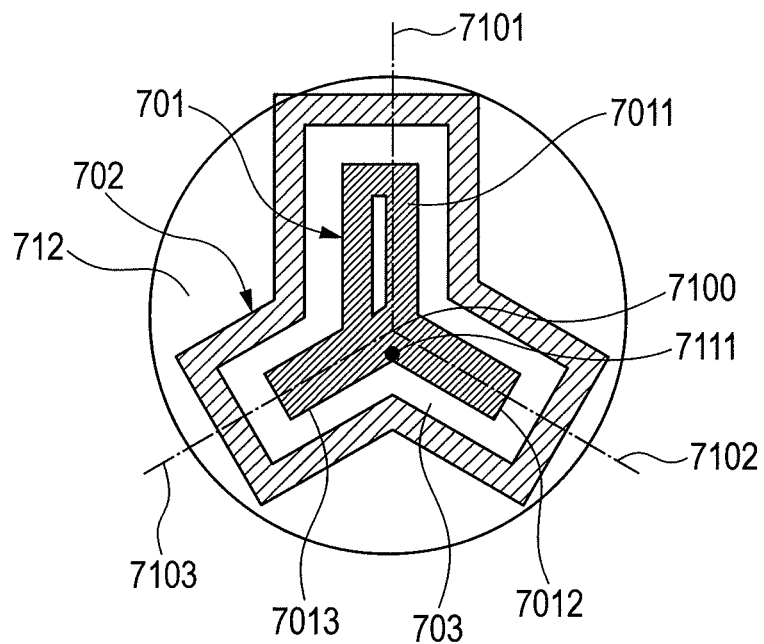
FIG. 10 is a diagram showing a magnet unit of a sixth example according to an embodiment of the present invention.

Meanwhile, FIG. 10 is a diagram showing a magnet unit of a sixth example to which the present embodiment can be applied. Radial axes 7101, 7102, and 7103 extend from a radial center 7100 on a yoke 712 which is rotatable about a rotation center 7111. Magnet elements 7011, 7012, and 7013 are fixed along these radial axes and constitute an internal magnet unit 701. An external magnet unit 702 is disposed in the periphery of the internal magnet unit 701 without contacting the internal magnet unit 701 and forms a circuit 703. The magnet unit of the sixth example shown in FIG. 10 shows an example in which the area of the internal magnet unit 701 is increased by way of increasing the width of the magnet element 7011. By increasing the width only in the magnet element 7011, it becomes possible to increase the magnetic flux density on the magnetic track generated by the magnet unit on the target and to perform the discharge stably. Here, when the internal magnet unit 701 has the N-pole, the external magnet unit 702 has the S-pole. The inverse does not cause any problem at all.

Example 1

Regarding the mode shown in FIG. 10 to which an embodiment of the present invention can be applied, the shape of the magnetic track and the magnetic flux density were confirmed and also the erosion shape was confirmed. The yoke 712 including iron as a main component (Japanese Industrial Standards SS400) has a diameter of 370 mm and a thickness of 10 mm. The magnet element 7011, which has a length of 100 mm, a width of 70 mm, and a height of 37 mm, the magnet element 7012, which has a length of 150 mm, a width of 40 mm, and a height of 37 mm, and the magnet element 7013, which has a length of 150 mm, a width of 40 mm, and a height of 37 mm, are fixed onto the yoke 712 with epoxy series adhesive for constituting the internal magnet 701. The outer surface of the internal magnet unit 701 is assumed to have the S-pole (i.e., adhesion surface of the yoke 712 has the N-pole). The external magnet unit 702 (outer surface has the N-pole) is fixed onto the yoke 712 with the epoxy series adhesive keeping a spacing of 20 mm without contacting the internal magnet unit 701. Here, a magnet having a maximum energy product of 50 MGOe is applied for both of the internal magnet unit 701 and the external magnet unit 702. The magnet elements 7011, 7012, and 7013 constituting the internal magnet unit 701 have positional relationships of being disposed along the radial axis 7101, 7102, and 7103 extending having an angle of 120° in between from the radial center 7100, respectively. Then, the off-center distance is determined to be 25 mm.

A nonmagnetic target (material: Cr) having a diameter of 380 mm and a thickness of 6.5 mm is fixed on the magnet unit. At this time, the non-magnetic target is fixed so as to cause the distance between the surface of the magnet unit and the surface of the non-magnetic target 1501 to become 35 mm.

Figure 11:
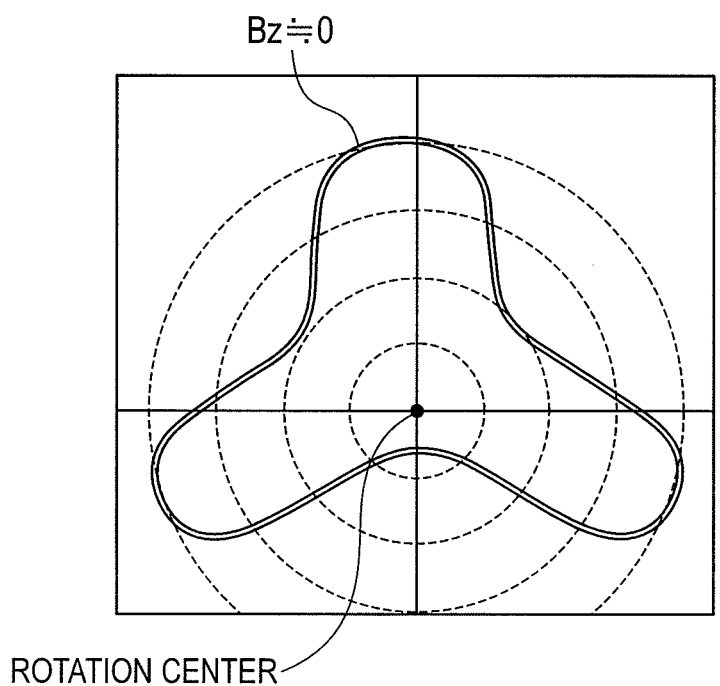
FIG. 11 is a diagram showing a magnetic track shape appearing on the surface of a non-magnetic target (region where a magnetic field component parallel to the normal line of the non-magnetic target surface is 0 mT) when a magnet unit of a sixth example according to an embodiment of the present invention is used.
Figure 12:
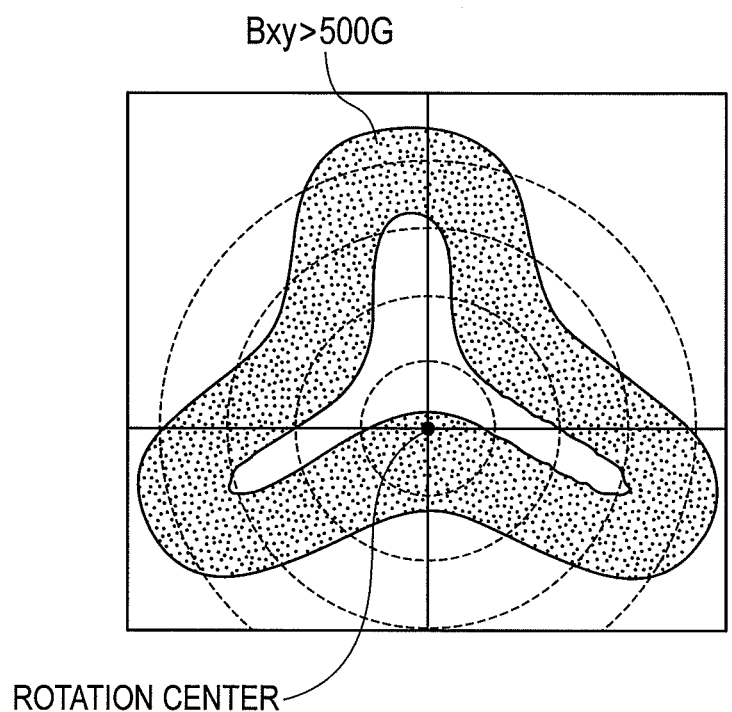
FIG. 12 is a diagram showing a magnetic track shape appearing on the surface of a non-magnetic target (region where a magnetic field component parallel to the surface of the non-magnetic target is equal to or larger than 50 mT) when a magnet unit of a sixth example according to an embodiment of the present invention is used.

As a result of confirming the magnetic track shape appearing on the surface of the non-magnetic target 1501, a magnetic track shape was obtained as shown in FIG. 11. Further, a region, where a magnetic field component parallel to the surface of the non-magnetic target 1501 is equal to or larger than 50 mT, is obtained as shown in FIG. 12. Since the discharge (firing) can be performed stably if the magnetic flux density is equal to or larger than 50 mT in the direction of the target surface in the periphery of the magnetic track, the discharge can be performed stably in the magnet unit to which the present invention can be applied. Here, the magnetic flux density is acquired by a computer while a magnetic flux measuring means (e.g., gaussmeter) is caused to travel on the target in the direction of the target surface, and magnetic track (FIG. 11) is obtained by way of extracting a point where the magnetic flux density parallel to the normal line direction of the target surface became zero. Then, when a point where the magnetic flux density parallel to the target surface is equal to or larger than 50 mT is extracted, a result is obtained as shown in FIG. 12.

Figure 13:
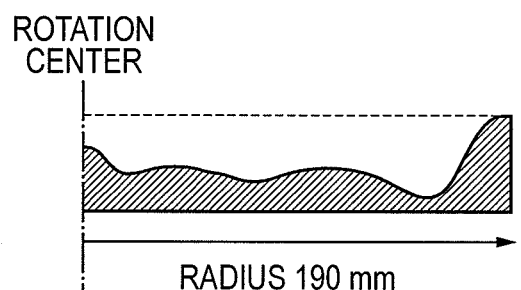
FIG. 13 is a diagram showing an erosion shape caused in a non-magnetic target when a magnet unit of a sixth example according to an embodiment of the present invention is used.

Meanwhile, the erosion shape caused on the target 1501 is shown in FIG. 13. FIG. 13 shows the erosion shape on one side of the rotation center. The erosion progresses almost uniformly across the whole area. By aggressively providing the magnetic track region approximately perpendicular to the rotation direction as in an embodiment of the present invention, it becomes possible easily to cause the erosion to progress uniformly from the target center to the outer side.

Example 2

This time, a magnetic target 1502 of iron-cobalt alloy (saturation magnetic flux density: 2.4 T) is disposed close to the magnet unit shown in Example 1 and the magnetic track shape and the magnetic flux density were confirmed and also the eroded shape was confirmed on the magnetic target 1502. Here, the target has a diameter of 380 mm and a thickness of 3 mm, and the distance between the surface of the magnet unit and the surface of the magnetic target 1502 is 16 mm.

Figure 14:
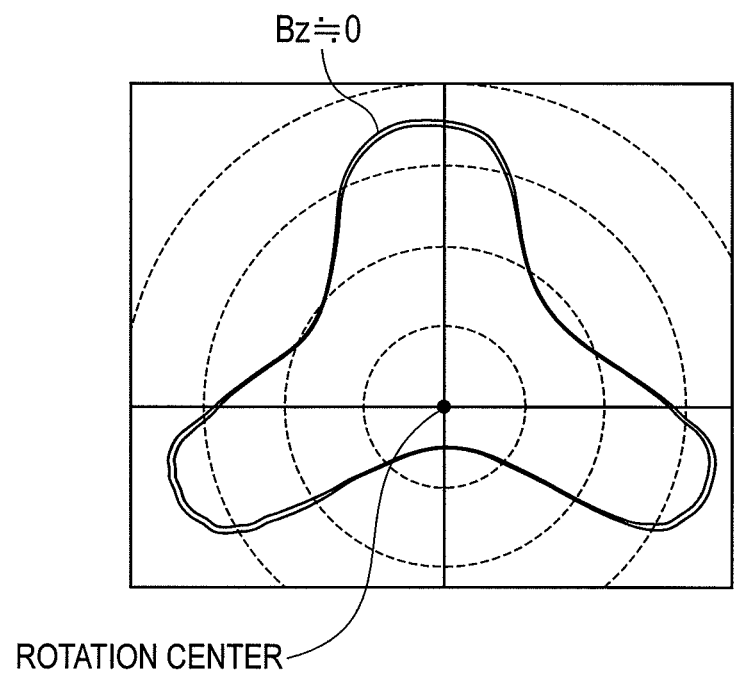
FIG. 14 is a diagram showing a magnetic track shape appearing on the surface of a magnetic target (region where a magnetic field component parallel to the normal line of the magnetic target surface is 0 mT) when a magnet unit of a sixth example according to an embodiment of the present invention is used.
Figure 15:
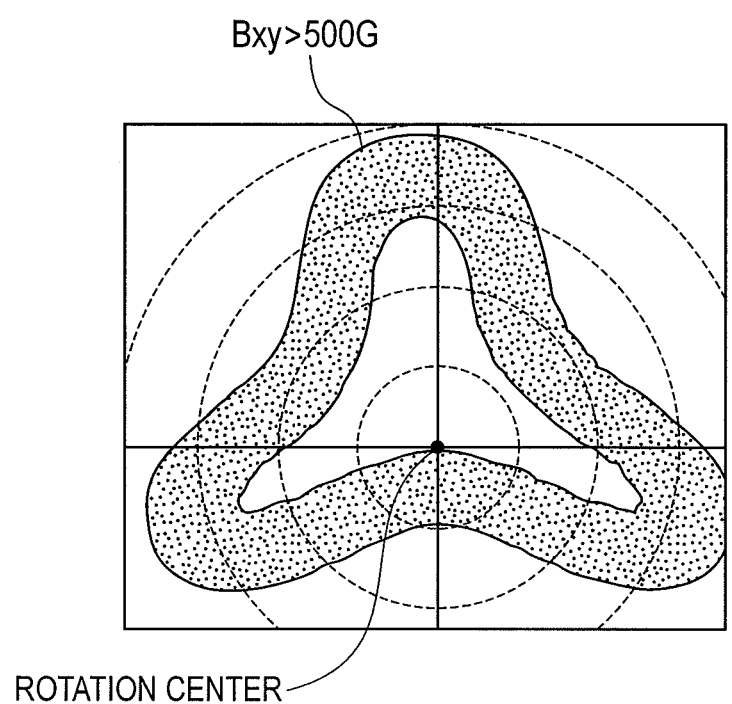
FIG. 15 is a diagram showing a magnetic track shape appearing on the surface of a magnetic target (region where a magnetic field component parallel to the surface of the magnetic target is equal to or larger than 50 mT) when a magnet unit of a sixth example according to an embodiment of the present invention is used.

At this time, the magnetic track shape appearing on the magnetic target 1502 was confirmed and a result was obtained as shown in FIG. 14. Further, a region, where a magnetic field component parallel to the surface of the magnetic target 1502 was equal to larger than 50 mT, was obtained as shown in FIG. 15, and it was confirmed that a magnetic flux density enabling stable discharge was obtained also on the magnetic target in the magnet unit to which an embodiment of the present invention could be applied.

Figure 16:
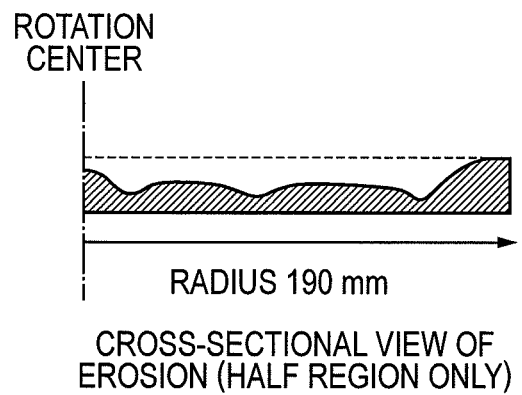
FIG. 16 is a diagram showing an erosion shape caused in a magnetic target when a magnet unit of a sixth example according to an embodiment of the present invention is used.

Then, the erosion shape caused on the magnetic target 1502 is shown in FIG. 16. FIG. 16 shows the erosion shape on one side of the rotation center and it is clear that the erosion has progressed uniformly across the whole area. By aggressively providing the magnetic track region approximately perpendicular to the rotation direction as in an embodiment of the present invention, it becomes possible easily to cause the erosion to be caused uniformly from the target center to the outer side.

Example 3

Figure 17:
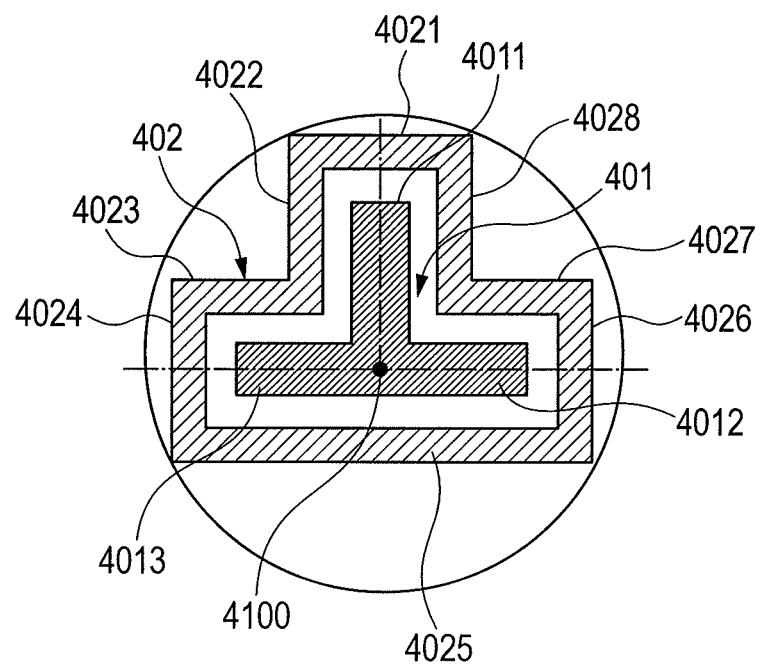
FIG. 17 is a diagram showing a magnet unit of a seventh example according to an embodiment of the present invention.

FIG. 17 shows a magnet unit of a seventh example which is a modification of the magnet unit of the first example shown in FIG. 2. The feature of the magnet unit of the seventh example shown in FIG. 17 is the following point. An internal magnet unit 401 (e.g., S-pole) includes three magnet elements 4011, 4012, and 4013 which extend radially in at least n-directions (n=3) from the radial center 4100 which coincides with the rotation center of the yoke. Meanwhile, an external magnet unit 402 (e.g., N-pole) has a (3n−1) or more-angular shape (3×3−1=8) which are arranged so as to surround the above three magnet elements 4011, 4012, and 4013 and includes (3n−1) external magnets (3×3−1=8) 4021 to 4028. In such a configuration, the above three magnet elements 4011, 4012, and 4013 are arranged in the circumferential direction having angles of 90 degrees, 90 degrees, and 180 degrees in between, respectively.

Note that, also in the magnet unit of the seventh example shown in FIG. 17, each of the magnet elements 4021 to 4028 of the external magnet unit 402 are provided in parallel to some one of the magnet elements 4011, 4012, and 4013 so as to have a gap of the same spacing (e.g., not smaller than 10 mm and not larger than 40 mm) in between. The erosion shape was confirmed for the non-magnetic target when the radial angles were arranged as 90 degrees, 90 degrees, and 180 degrees as in FIG. 17 and the erosion has progressed almost uniformly across the whole target area as shown in FIG. 18.

Example 4

Figure 19:
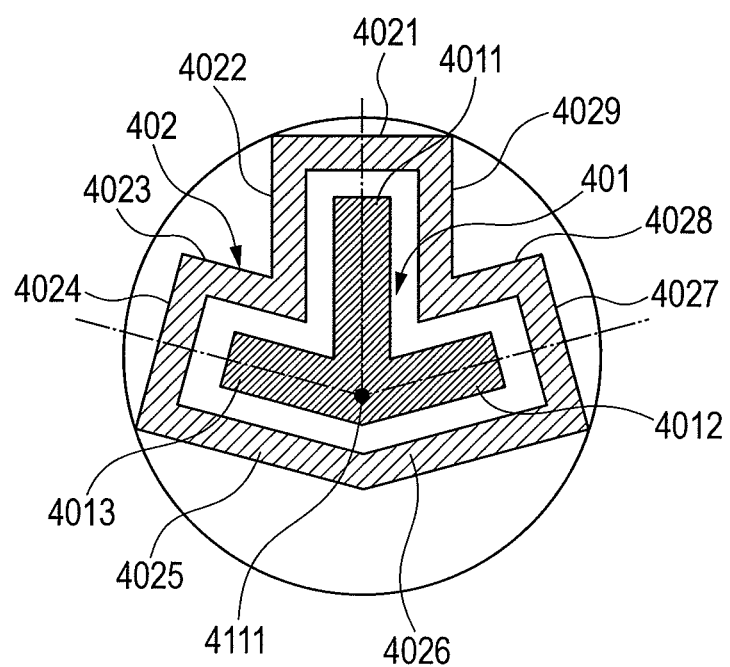
FIG. 19 is a diagram showing a magnet unit of an eighth example according to an embodiment of the present invention.

FIG. 19 is a diagram showing a magnet unit of an eighth example which is a modification of the first example shown in FIG. 2. In FIG. 19, an internal magnet unit 401 (e.g., S-pole) includes three magnet elements 4011, 4012, and 4013 which extend radially in at least n-directions (n=3) from the rotation center of the yoke. An external magnet unit 402 (e.g., N-pole) has a 3n-angular shape (3×3=9) which are arranged so as to surround the above three magnet elements 4011, 4012, and 4013 and includes 3n magnet elements (3×3=9) 4021 to 4029. In such a configuration, the above three magnet elements 4011, 4012, and 4013 are arranged in the circumferential direction having angles of 75 degrees, 75 degrees, and 210 degrees in between, respectively.

Figure 18:
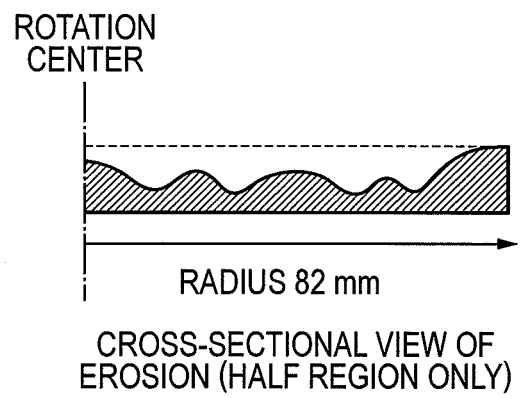
FIG. 18 is a diagram showing an erosion shape caused in a target when a magnet unit of a seventh example according to an embodiment of the present invention is used.
Figure 20:
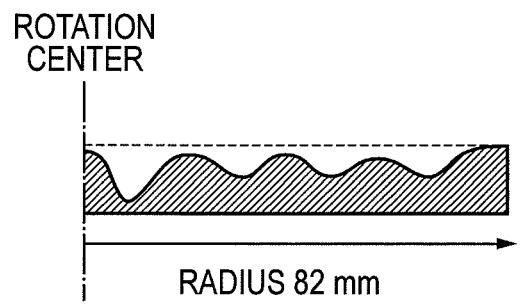
FIG. 20 is a diagram showing an erosion shape caused in a target when a magnet unit of an eighth example according to an embodiment of the present invention is used.

Note that, also in the magnet unit of the eighth example shown in FIG. 18, each of the magnet elements 4021 to 4029 of the external magnet unit 402 are provided in parallel to some one of the magnet elements 4011, 4012, and 4013 so as to have a gap of the same spacing (e.g., not smaller than 10 mm and not larger than 40 mm) in between. When the radial angles were set as 75 degrees, 75 degrees, and 210 degrees as in FIG. 19, the erosion speed was increased in the center part of the target compared to the other region as shown in FIG. 20 and the target life expired in a shorter time than in the other examples. This is because, when the radial angle was increased to be larger than 180 degrees, the magnetic track was formed as surrounding the rotation center to increase the plasma existence time and the erosion speed was increased.

Note that, in the magnet unit of the eighth example, while the problem as described above does not occur when the radial center 4100 is moved apart from the rotation center 4111 (i.e., when the off-center distance is made larger), it is difficult to solve this problem from the viewpoint of the magnet unit design as described in the following. When the off-center distance is increased, the magnetic circuit needs to be included in the upper half of the magnet unit. However, a region to be allocated to the magnetic circuit is limited only in the upper half of the magnet unit and each width of the magnet elements and the width of the magnetic circuit need to be reduced. From these restrictions, the magnetic flux density from the magnet unit is reduced and it is difficult to use this magnet unit for the magnetic target.

Example 5

Figure 21:
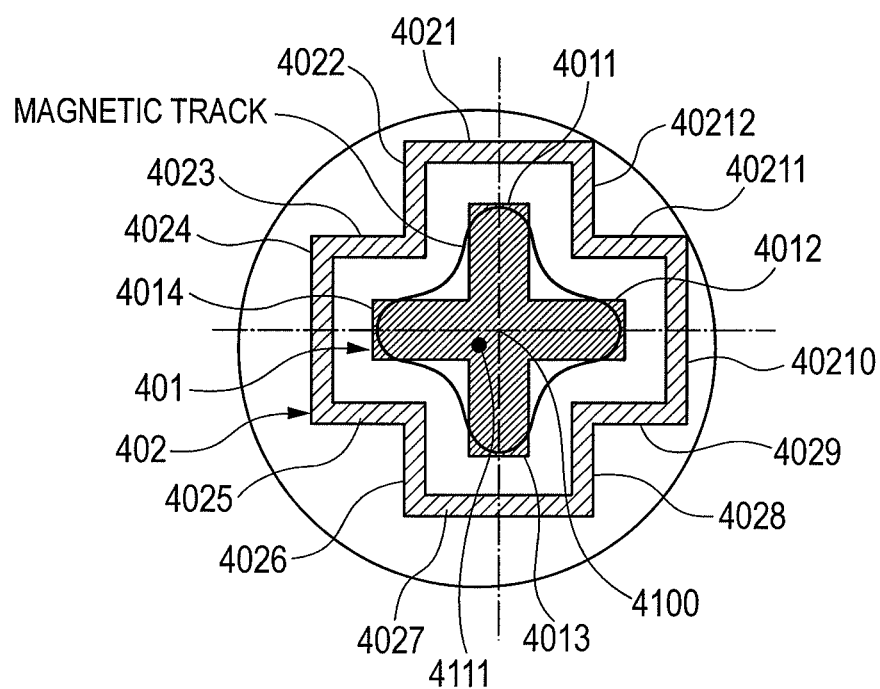
FIG. 21 is a diagram showing a magnet unit of a ninth example according to an embodiment of the present invention.

FIG. 21 is a diagram showing a magnet unit of a ninth example according to an embodiment of the present invention. In FIG. 21, an internal magnet unit 401 (e.g., S-pole) includes four internal magnets 4011, 4012, 4013, and 4014 which extend radially in at least n-directions (n=4) from a radial center 4100 which is different from the rotation center of the yoke. An external magnet unit 402 (e.g., N-pole) has a 3n-angular shape (3×4=12) which are arranged so as to surround the above four internal magnets 4011, 4012, 4013, and 4014 and includes 3n magnet elements (3×4=12) 4021 to 4029, 40210, 40211, and 40212. In such a configuration, the above four internal magnets 4011, 4012, 4013, and 4014 are arranged in the circumferential direction having an angle of 90 degrees in between.

Note that, also in the magnet unit of the ninth example shown in FIG. 21, each of the magnet elements 4021, 4022, 4023, 4024, 4025, 4026, 4027, 4028, 4029, 40210, 40211, and 41212 of the external magnet unit 402 are provided in parallel to some one of the magnet elements 4011, 4012, 4013, and 4014 so as to have a gap of the same spacing (e.g., not smaller than 10 mm and not larger than 40 mm) in between.

Figure 22:
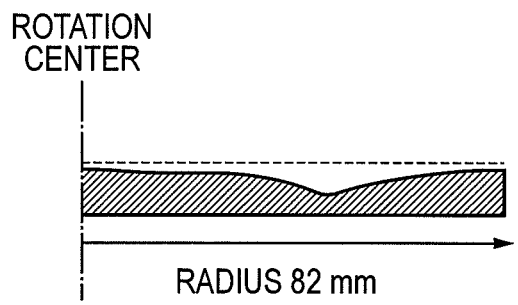
FIG. 22 is a diagram showing an erosion shape caused in a target when a magnet unit of a ninth example according to an embodiment of the present invention is used.

FIG. 22 shows a cross-sectional view of the erosion when the number of the radiation directions for the internal magnet unit 401 is four. When non-magnetic material (chromium) is used for the target, the erosion had progressed almost uniformly across the whole surface of the target, but when NiFe magnetic material was used for the target, the erosion was concentrated on a part of the region on the target. The reason of this phenomenon will be described as follows. Since more magnetic fluxes passed through the inside of the target when the magnetic material target was used, the magnetic track on the target came to have a smaller width in the curve. In other words, a region directed perpendicularly to the rotation direction was reduced in the magnetic track and a region parallel to the rotation direction was increased. Thereby, the magnetic flux was concentrated on the eroded portion and the plasma density was increased further to accelerate the erosion as the erosion progressed. Accordingly, while the four radiation directions are still effective for the case of using the non-magnetic material as the target material, the number of radiation directions is preferably three for the case of using a material having a saturation magnetic flux density equal to or higher than 1.5 T.

In the magnetron used in the sputtering process, the magnetic track generated on the target generally has a ring shape without ends because a charged particle is efficiently confined there. As described above, as the region of the magnetic track directed perpendicularly to the rotation direction is increased, and as the number of the magnetic tracks is increased, the concentration of the erosion is suppressed more and the utilization efficiency of the target is expected to be improved more. However, when the number is increased excessively, the region directed perpendicularly to the rotation direction is reduced because of a geometric restriction in the magnetic circuit, and the region parallel to the rotation direction is increased this time and the concentration of the erosion occurs. In addition, since the magnetic track is required not to have ends, when the number directed perpendicularly to the rotation direction is reduced, the region parallel to the rotation direction is increased and the concentration of the erosion occurs. On the basis of these considerations, the number of the magnetic tracks directed perpendicularly to the rotation direction is preferably five to eight for the non-magnetic target and five or six for the magnetic target.

While the preferable embodiments of the present invention have been explained above, these are illustrations for explaining the present invention, and do not intend to limit the range of the present invention only to these embodiments. The present invention can be carried out in various modes different from the above embodiments in a range without departing from the gist thereof. The present invention is apparently effective also for a case having a different substrate size and a different kind of substrate.

For example, as the magnetic pole of the internal magnet unit and the magnetic pole of the external magnet unit are required only to be different from each other, the internal magnet unit may be set to have either the S-pole or the N-pole. The present invention is also effective when the diameter of the magnet unit is reduced to 150 mm or inversely increased to 450 mm, and also effective when the maximum energy product of the magnet material is reduced to 26 MGoe and when magnet materials having different maximum energy products from each other are combined. Further, the present invention can be applied to target materials of metal such as ruthenium, platinum and palladium, insulating material such as silicon oxide, magnesium oxide, and aluminum oxide, and ferromagnetic material such as NiFe and FeCoB, and also applied to a target having a relatively weak magnetism such as CoCr and PtB.

What is claimed is:

1. A magnet unit of a magnetron sputtering apparatus that forms a magnetic track as a group of regions where a tangential line of a magnetic force line generated on a target becomes parallel to a surface of the target, the magnet unit comprising:

a member configured to be provided with a predetermined magnet;

an internal magnet unit that is provided for the member and includes n magnet elements extending radially in a surface of the member from a predetermined position of the member in at least n directions, the n magnet elements having one polarity on a side opposite to the member; and an external magnet unit provided for the member so as to surround the internal magnet unit along a shape of the internal magnet unit, the external magnet unit having the other polarity on a side opposite to the member, wherein n is a positive integer equal to or larger than 3, and wherein both shapes of an internal magnet unit side of the external magnet unit and an opposite side of the internal magnet unit side with respect to the external magnet unit are a polygonal shape having (3n−1) or more sides.

2. The magnet unit of the magnetron sputtering apparatus according to claim 1, further comprising a rotation mechanism rotating the member about a rotation center of the member, wherein the predetermined position and the rotation center coincide with each other.

3. The magnet unit of the magnetron sputtering apparatus according to claim 1, further comprising a rotation mechanism rotating the member about a rotation center of the member, wherein the predetermined position and the rotation center are different from each other.

4. The magnet unit of the magnetron sputtering apparatus according to claim 1,
wherein each of the n magnet elements is provided along each of radial axes extending from the predetermined position, and
wherein each of the radial axes is arranged in a circumferential direction with an angle equal to or smaller than 180° with respect to a neighboring radial axis.

5. The magnet unit of the magnetron sputtering apparatus according to claim 1,
wherein each of the n magnet elements is provided along each of radial axes extending from the predetermined position, and
wherein each of the radial axes is arranged in a circumferential direction with an angle of 360°/n with respect to a neighboring radial axis.

6. The magnet unit of the magnetron sputtering apparatus according to claim 1, wherein a gap not smaller than 10 mm and not larger than 40 mm is provided between the internal magnet unit and the external magnet unit across a whole periphery of the internal magnet unit.

7. The magnetron sputtering apparatus comprising:
a processing chamber capable of vacuum evacuation;
a substrate holder that is provided in the processing chamber and capable of holding a substrate as an object to be processed;
a cathode electrode that is arranged so as to face the substrate holder and to which discharge power is supplied;
a target mounting plane that is provided at a substrate holder side of the cathode electrode and capable of mounting a target; and
a transfer mechanism transferring the substrate to a position between the substrate holder and the cathode electrode,
wherein the apparatus is configured such that the target can be mounted at the substrate holder side of the cathode electrode, and
wherein the magnet unit according to claim 1 is disposed at the cathode electrode on a side opposite to the side of the substrate holder.

8. The magnet unit of the magnetron sputtering apparatus according to claim 1, wherein each side of the external magnet unit of the polygonal shape having (3n−1) or more sides is parallel to a certain side of magnet elements of the internal magnet unit with same spacing therebetween.

9. The magnet unit of the magnetron sputtering apparatus according to claim 1, wherein one of the n magnet units has a cavity.

* * * * *